United States Patent
Karakozova

(10) Patent No.: US 9,601,217 B1
(45) Date of Patent: Mar. 21, 2017

(54) METHODS AND CIRCUITRY FOR IDENTIFYING LOGIC REGIONS AFFECTED BY SOFT ERRORS

(71) Applicant: Altera Corporation, San Jose, CA (US)

(72) Inventor: Olga Karakozova, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 348 days.

(21) Appl. No.: 14/064,050

(22) Filed: Oct. 25, 2013

(51) Int. Cl.
  *G11C 29/44* (2006.01)
  *G11C 29/52* (2006.01)
  *G11C 29/54* (2006.01)

(52) U.S. Cl.
  CPC ............... *G11C 29/44* (2013.01); *G11C 29/52* (2013.01)

(58) Field of Classification Search
  CPC ........... G11C 29/44; G11C 29/52; G11C 7/10; G11C 29/56; G11C 29/48; G11C 11/40; G06F 11/1048; G06F 11/10
  See application file for complete search history.

(56) References Cited

U.S. PATENT DOCUMENTS

| | | | | |
|---|---|---|---|---|
| 7,389,446 B2* | 6/2008 | Krasnansky | ........ | G06F 11/1008 714/42 |
| 8,322,610 B2 | 12/2012 | Guthery | | |
| 8,516,339 B1* | 8/2013 | Lesea et al. | ................... | 714/763 |
| 8,694,864 B1* | 4/2014 | Ngo | .............................. | 714/769 |
| 8,713,409 B1* | 4/2014 | Tseng et al. | ................... | 714/768 |

FOREIGN PATENT DOCUMENTS

EP  1848001  10/2007

* cited by examiner

*Primary Examiner* — April Y Blair
*Assistant Examiner* — Dipakkumar Gandhi
(74) *Attorney, Agent, or Firm* — Treyz Law Group, P.C.; Jason Tsai; Vineet Dixit

(57) ABSTRACT

Integrated circuits with single event upset (SEU) detection circuitry are provided. The SEU detection circuitry may include an error detection block for detecting soft errors and a sensitivity processor that determines whether or not to correct the detected soft errors. The sensitivity processor may be used to access a sensitivity map header (SMH) file that is stored on external memory. The sensitivity map header file contains information that can help identify which logic region on the integrated circuit the soft error affects and whether or not that soft error can critically cause functional failure for the integrated circuit. Depending on the criticality of the soft error, different corrective actions may be taken.

20 Claims, 11 Drawing Sheets

METHODS AND CIRCUITRY FOR IDENTIFYING LOGIC REGIONS AFFECTED BY SOFT ERRORS

BACKGROUND

This relates to integrated circuits and more particularly, to circuitry operable to detect soft memory errors on integrated circuits such as programmable integrated circuits and further operable to identify particular portions of a programmable integrated that is affected by the detected soft memory errors.

Programmable integrated circuits are a type of integrated circuit that can be programmed by a user to implement a desired custom logic function. In a typical scenario, a logic designer uses computer-aided design tools to design a custom logic circuit. When the design process is complete, the tools generate configuration data. The configuration data is loaded into memory elements to configure the devices to perform the functions of the custom logic circuit.

Memory elements are often based on random-access-memory (RAM) cells. Because the RAM cells are loaded with configuration data during device programming, the RAM cells are sometimes referred to as configuration memory or configuration random-access-memory cells (CRAM). During normal operation of a programmable device, loaded CRAM cells produce static output signals that are applied to the gates of transistors (e.g., pass transistors). The CRAM output signals turn some transistors on and turn other transistors off. This selective activation of certain transistors on the device customizes the operation of the device so that the device performs its intended function.

When operating in a system, programmable devices are subject to environmental background radiation. Particularly in modern programmable devices that contain large numbers of CRAM cells, there is a possibility that a radiation strike on a CRAM cell will cause the CRAM cell to change its state. For example, a CRAM cell storing a "1" configuration bit may flip its state so that the cell erroneously stores a "0" bit. When a CRAM cell changes state, the transistor that is controlled by that CRAM cell will be placed into an erroneous state. The transistor might, for example, be turned on when it should have been turned off.

Radiation-induced errors that arise in configuration random-access-memory cells are sometimes referred to as soft errors. One way in which soft errors can be addressed is to change the design of the CRAM cells. However, changes to the CRAM cells can introduce undesired circuit complexity and can consume additional circuit real estate.

Programmable devices sometimes include error detection circuitry that continuously monitors an entire array of CRAM cells. If an error is detected in the array, an error flag may be set. Systems that require highly reliable operations can monitor the status of the error flag to determine whether the programmable device has experienced any soft errors. So long as no errors are present, the system allows the programmable device to operate normally. If, however, the state of the error flag indicates that one of the configuration random-access-memory cells on the device has exhibited a soft error, the system can reconfigure the device by reloading the original configuration data into the configuration random-access-memory cells. Reloading the entire programmable device every time a soft error is detected may, however, result in unnecessarily frequent disruptions.

In an effort to reduce the frequency of system disruptions, techniques have been developed that determine whether a particular bit flip is a design sensitive bit. This technique allows the user to determine whether a soft error has an impact to the system by first detecting the error location and then analyzing whether the erroneous bit is in use by the design. This technique, however, is only capable of differentiating between bits that are used by the design and bits that are not used by the design. Erroneous bits, even those that are part of non-critical logic but are nevertheless part of the logic design, will still trigger a device reconfiguration.

It is within this context that the embodiments described herein arise.

SUMMARY

Integrated circuits such as programmable integrated circuits may have memory elements coupled to an error detection circuit. The error detection circuitry may be a cyclic redundancy check (CRC) circuit that is used to monitor (scan) the memory elements for the presence of soft errors.

For example, a programmable integrated circuit may contain one or more arrays of configuration random-access-memory (CRAM) cells. Each array may contain rows and columns of configuration random-access-memory cells that are used for storing configuration data. The integrated circuit may also be organized into different logic regions, each logic region having its own set of memory arrays. Memory cells that are connected to a common address line may collectively be referred to as a "frame." The error detection and correction circuitry may process each frame to scan for soft errors.

In response to detecting an erroneous bit in the memory elements with the error detection circuit, a sensitivity processor may be used to determine whether the erroneous bit is being used by the integrated circuit to implement a predetermined user-defined logic function. The sensitivity processor may be provided on-chip or may be a separate module formed off-chip. In response to determining that the erroneous bit is in use by the custom design, the sensitivity processor may perform a lookup operation to access a sensitivity map header (SMH) file that is stored on external memory. SMH information retrieved in this way may be used to determine whether the erroneous bit is critical to maintain proper functionality of the integrated circuit.

If the erroneous bit is determined to be critical in maintaining proper functionality of the integrated circuit (i.e., if the erroneous bit will cause functional failure of the design), the sensitivity processor may issue a corrective action to fix the erroneous bit. As examples, the erroneous bit may be corrected via device reconfiguration (e.g., by reconfiguring all the memory elements on the device) or via partial reconfiguration (e.g., by reconfiguring only a subset of the memory elements on the device). If the erroneous bit is determined to be not critical to maintain proper functionality of the integrated circuit (i.e., if the erroneous bit will not propagate enough to cause functional failure of the design or if the erroneous bit is not essential to the functionality of the integrated circuit), the integrated circuit may continue to operate in normal mode without correcting the erroneous bit.

The SMH information that is stored on external memory may include a frame information array, an offset map information array, a sensitivity data array, and a region map information array. Accessing the SMH information may include retrieving a frame information string from the frame information array, retrieving an offset map string from the offset map information array based at least partly on the frame information string, and retrieving a sensitivity data word from the sensitivity data array based at least partly on the offset map string. The sensitivity data word may be used to obtain a sensitivity tag. The sensitivity tag may be used to retrieve a bitmask from the region map information array. The retrieved bitmask may indicate all logic regions on the integrated circuit that the erroneous bit affects. Each bitmask may therefore correspond to a different sensitivity tag.

Different corrective actions may be taken for regions corresponding to different sensitivity tags. For example, a first bit corresponding to a sensitivity tag of a first type may trigger a first corrective action. A second bit corresponding to a second sensitivity tag of a second type may trigger a second corrective action that is different than the first corrective action. There may at least be three different types of sensitivity tags each of which is used to identify different respective logic regions on the integrated circuit.

Further features of the present invention, its nature and various advantages will be more apparent from the accompanying drawings and the following detailed description.

DETAILED DESCRIPTION

Embodiments of the present invention relate to integrated circuits that include memory elements. In particular, the integrated circuits may include error detection circuitry for detecting soft memory errors and associated sensitivity processing circuitry for determining whether the detected errors affect the overall functionality of the integrated circuit. Depending on the location of an error, that error may be assigned a corresponding tag. Depending on the type of tag assigned, appropriate correction action may be taken to correct that error. It will be recognized by one skilled in the art, that the present exemplary embodiments may be practiced without some or all of these specific details. In other instances, well-known operations have not been described in detail in order not to unnecessarily obscure the present embodiments.

Integrated circuits that contain memory elements may include memory chips, digital signal processing circuits with memory arrays, microprocessors, application specific integrated circuits with memory arrays, programmable logic device integrated circuits or other programmable integrated circuits in which memory elements are used for configuration memory, or other suitable integrated circuits.

Integrated circuits such as programmable integrated circuits use programmable memory elements to store configuration data. During the programming of a programmable integrated circuit, configuration data is loaded into the memory elements. During operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

Memory elements may be organized in arrays having numerous rows and columns. For example, memory array circuitry may be formed in hundreds or thousands of rows and columns on a programmable logic device integrated circuit. Each row that is being addressed is sometimes referred to as a "frame." Programmable integrated circuit 10 of FIG. 1 is an example of an illustrative integrated circuit on which memory array circuitry may be formed.

Figure 1:
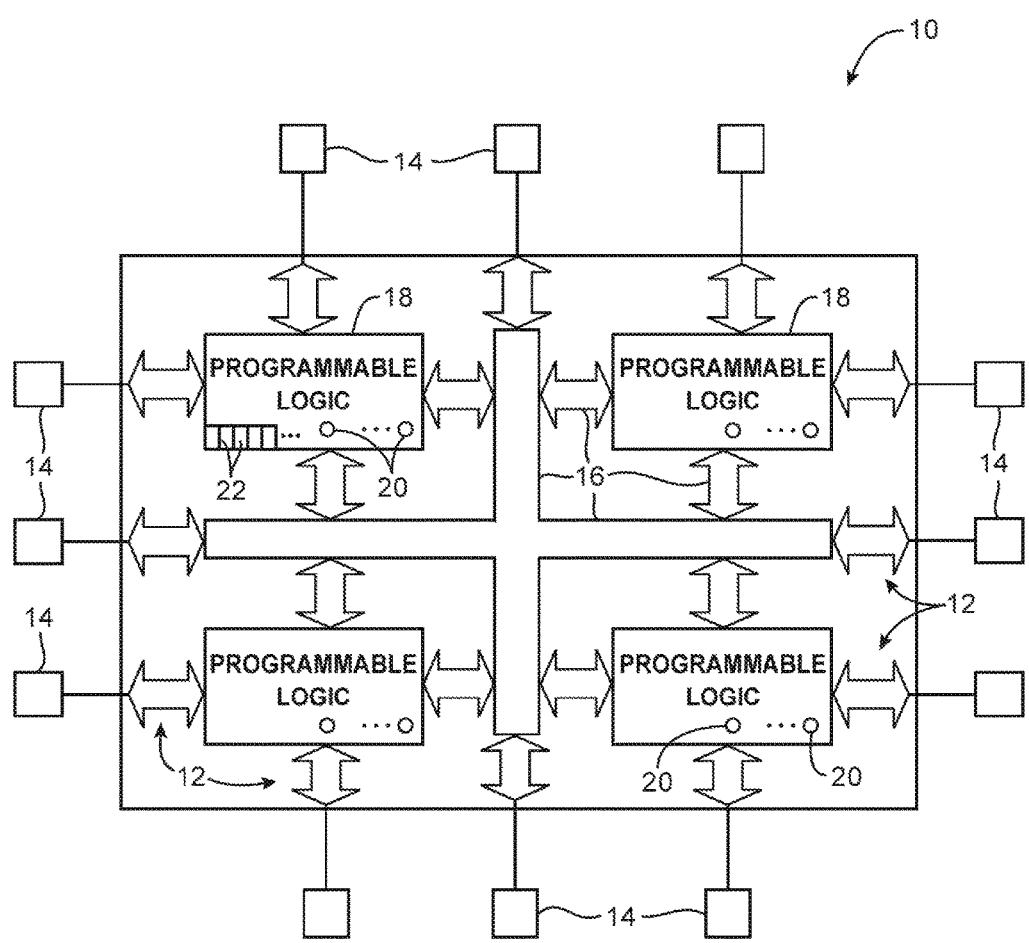
FIG. 1 is a diagram of an illustrative programmable integrated circuit in accordance with an embodiment of the present invention.

As shown in FIG. 1, programmable integrated circuit 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and input-output circuitry 12. Once loaded, the memory elements each provide a corresponding static control output signal that controls the state of an associated logic component in programmable logic 18. Typically the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20. In the context of programmable integrated circuits, the memory elements store configuration data and are therefore sometimes referred to as configuration random-access memory (CRAM) cells.

CRAM cells 20 that are loaded with configuration data may be subject to soft errors (e.g., errors induced by strikes from alpha particles, cosmic rays, and other sources of ionizing radiation). The change in state of even a single CRAM bit may disrupt the operation of device 10 and can oftentimes cause circuit malfunction. System disruption caused by random radiation strikes is sometimes referred to as a "single event upset" (SEU). The rate at which an integrated circuit is expected to fail due to SEUs is sometimes referred to as failures in time or "FIT." Systems that require high reliability such as telecommunication systems have stringent FIT rate requirements.

Integrated circuit 10 can exhibit a device FIT rate and a design effective FIT rate that is not necessarily equal to the device FIT date. The device FIT rate measures the rate at which any soft error occurs on device 10, whereas the actual design FIT rate measures the expected functional failure rate for a particular design. For example, the design FIT rate may only include failures associated with bits that critically affect the user-defined logic function and may exclude failures associated with erroneous bits that will not cause a circuit functional failure because either (i) the flipped bit is neither used by nor affects the user design, (ii) the error will not propagate enough to cause the desired logic function to fail, or (iii) the failed part of the logic is not essential to the overall functionality of device 10. As a result, the design effective FIT rate is typically significantly less than the device FIT rate.

Techniques have been developed that determine whether a particular bit flip is a design sensitive bit. This approach allows the user to determine if a soft error has an impact to the system by first detecting the error location and then analyzing whether the erroneous bit is used by the design. This approach, however, is only capable of differentiating between bits that are used by the design and bits that are neither used by the design nor affects the design (i.e., the conventional approach only address type (i) errors associated with bits that are neither used by nor affect the user design). Erroneous bits, even those that are part of non-critical logic but are nevertheless part of the logic design, will still trigger device reconfiguration. As a result, detecting and correcting errors in this way is not an effective way of reducing design effective FIT rate.

In an embodiment of the present invention, an integrated circuit 10 may be provided that includes SEU detection circuitry configured to detect soft errors, to identify particular portions of the design logic that are affected by the detected errors, and to classify the different types of soft errors based on the criticality of the error. This improved technique may, for example, substantially reduce design effective FIT rate by allowing the designer to specify non-critical logic in the design (e.g., to specify parts of the logic that is in use but are not essential to the overall functionality of the device), to increase system uptime by reducing the frequency of disruptive operations that correct the detected failures (e.g., by performing partial reconfiguration instead of full device reconfiguration on only the affected part of the logic), and by employing different corrective actions for the different types of errors.

Figure 2:
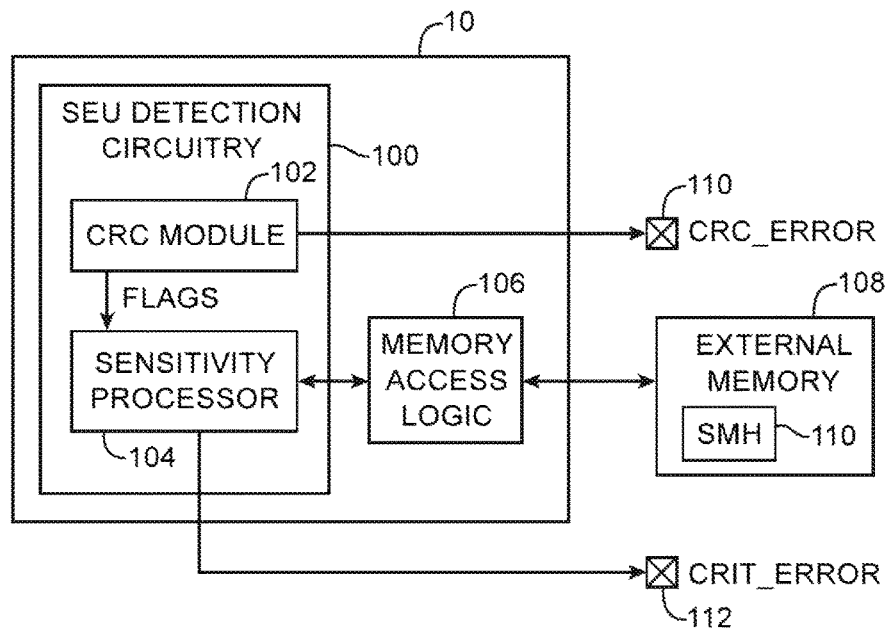
FIG. 2 is diagram of an illustrative system with on-chip sensitivity processing capabilities in accordance with an embodiment of the present invention.

In one suitable arrangement, device 10 may include at least SEU detection circuitry such as SEU detection circuitry 100 and associated logic circuitry such as memory access logic 106 configured to communicate with an external memory device 108 (see, e.g., FIG. 2). As shown in FIG. 2, SEU detection circuitry 199 may include an error checking circuit such as cyclic redundancy check (CRC) module 102 and a sensitivity processing circuit such as sensitivity processor 104. CRC module 102 may, for example, be used to detect and locate single-bit errors (or optionally flag for multi-bit errors) on a frame by frame basis. CRC module 102 may monitor device 10 to detect for the presence of a soft error. When a soft error is detected, module 102 may output an asserted CRC ERROR signal to I/O pin 110 and may output an error flag to sensitivity processor 104. SEU detection circuitry 100 may then decode the location of the error (e.g., circuitry 100 may obtain the bit, byte, and frame number associated with the erroneous bit).

Sensitivity processor 104 may then access external memory 108 via memory access logic 106. Memory access logic 106 may serve as an interface between sensitivity processor 104 and external memory 108. A file such as a sensitivity map header (SMH) image file 110 may be stored on external memory 108. Sensitivity processor 104 takes the supplied error bit location information and performs a lookup against the SMH file to determine the sensitivity regions affected by that particular error. The SMH file effectively contains a mask for different types of design sensitive bits in compressed format.

In general, CRAM bits on programmable device 10 are categorized as either "insensitive" bits or "sensitive" bits. Insensitive bits are bits that not used by the implemented circuit, whereas sensitive bits are bits that are used by the implemented circuit (i.e., bits that can potentially cause a circuit functional failure). There may be different types of sensitive bits, each of which is assigned a respective non-zero sensitivity tag.

For example, sensitive bits on device 10 that can be corrected via partial device reconfiguration (i.e., by configuring only a subset of the memory on device 10 that is affect by the SEU) may be assigned a sensitivity tag of a first value. Sensitive bits on device 10 that has to be correct via full device reconfiguration (i.e., by interrupting the entire system operation to reprogram all the memory on device 10) may be assigned a sensitivity tag of a second value that is different than the first value. Meanwhile, there may be sensitive bits on device 10 that are not essential for proper functionality of the overall circuit and that need not be corrected for (i.e., no correction action needs to be taken); these bits may be assigned a sensitivity tag of yet another value that is different than the first and second values. There may be yet other types of sensitive bits that are assigned other sensitivity tags and that required different corrective actions.

Collections of memory bits having the same sensitivity tag may be considered part of a particular sensitivity region. Sensitivity tags can therefore sometimes be referred to as region tags. In general, different sensitivity regions may exhibit different sensitivity tags that trigger different corrective actions.

The SMH file (sometimes referred to as a design sensitivity map) effectively contains information that identifies all sensitivity tags, if any, that is associated with a particular memory bit. The sensitivity map is stored in a compressed format (i.e., the SMH file should be considerably less than the total CRAM size) and should be optimized for read access since it will be referenced during normal device operation when an error is detected.

Figure 3:
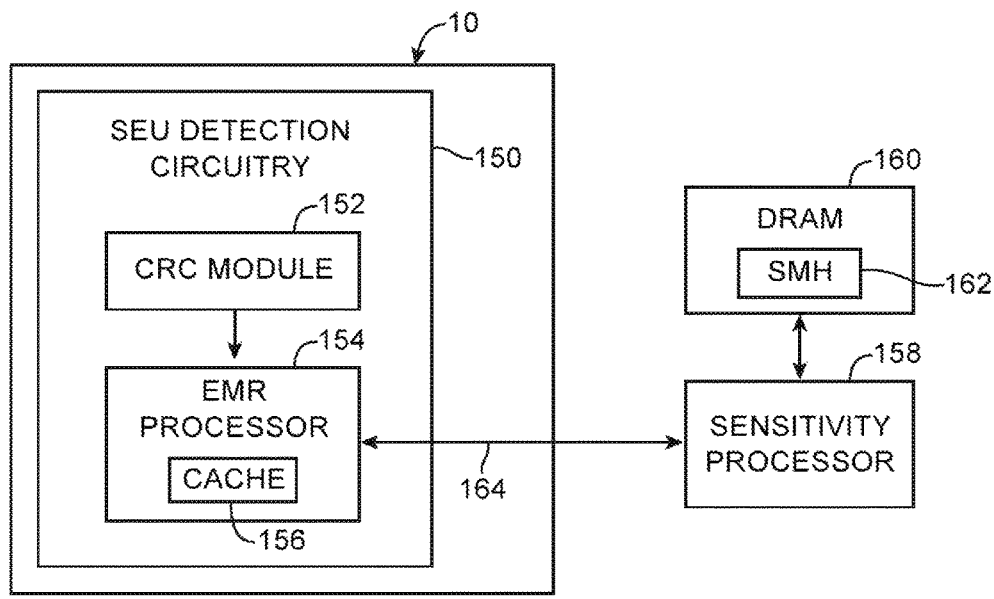
FIG. 3 is diagram of an illustrative system with off-chip sensitivity processing capabilities in accordance with an embodiment of the present invention.

The arrangement of FIG. 2 in which the sensitivity processing functionality is provided on-chip is merely illustrative. If desired, the sensitivity lookup processing may be provided off-chip (see, e.g., FIG. 3). As shown in FIG. 3, device 10 may include SEU detection circuitry 150 having CRC module 152 and an error message register (EMR) processor 154. Upon detection of a soft error, CRC module 152 may generate a corresponding EMR value that is then written into a cache 156 in EMR processor 154. EMR values may be written into the cache until the cache is full. For each new value that is written into cache 156, EMR processing unit 154 asserts an interrupt to sensitivity processor 158. In response, sensitivity processor 158 reads the EMR value and performs a lookup against an SMH file 162 that is stored on external memory 160 (e.g., dynamic random-access-memory circuitry) to determined the criticality of the flipped bit (e.g., sensitivity processor 158 may retrieve EMR data from cache 156 via data path 164). After processor 158 services the interrupt, EMR processing unit 154 advances a cache pointer and generates additional interrupt assertions if there are additional EMR values that have yet to be processed.

In both the on-chip and off-chip configurations, the sensitivity processor (e.g., on-chip sensitivity processor 104 or off-chip sensitivity processor 158) may be used to determine the required corrective response after the SMH lookup operation. In either configuration, the design sensitivity map (SMH) information is stored in external memory since the size of the sensitivity map is still too large, even in the compressed format, to be stored on device 10. As a result, device 10 should include external memory interface logic that implements a sensitivity map data lookup algorithm.

Figure 4:
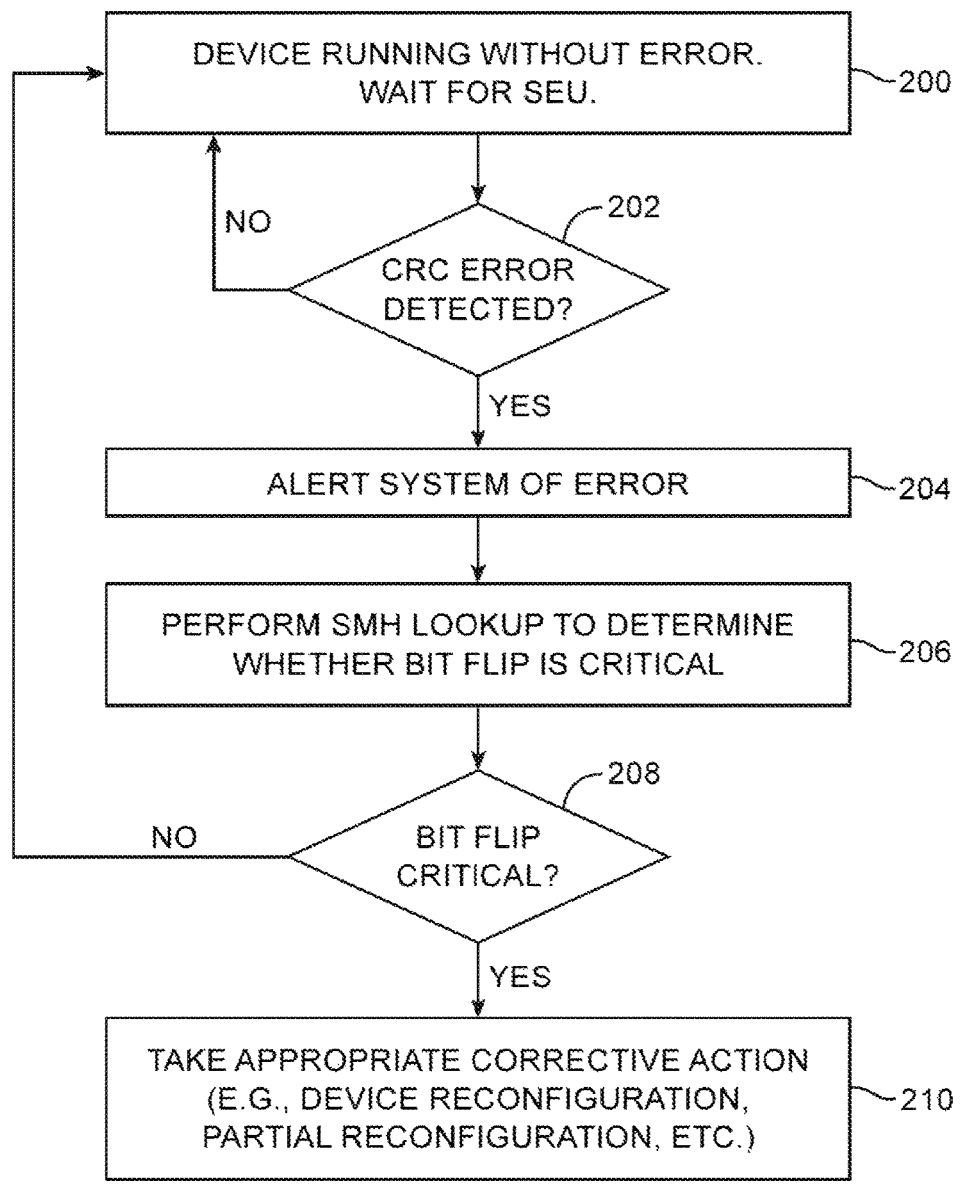
FIG. 4 is a flow chart of illustrative steps for operating error detection and correction circuitry in accordance with an embodiment of the present invention.

FIG. 4 is a flow chart of illustrative steps involved in operating device 10 to handle soft errors. At step 200, device 10 that is configured to perform a custom logic function may be running in normal operation (or normal mode) without error. A CRC block on device 10 may be used to monitor for the presence of soft errors on device 10 (step 202). If no soft error is detected, device 10 may continue to run in normal operation.

In response to detecting a soft error with the CRC block, the CRC block may generate corresponding error data and issue a system alert (step 204). At step 206, a sensitivity processor (i.e., an on-chip sensitivity processor or an off-chip sensitivity processor) may perform SMH lookup to determine whether the detected bit flip is a sensitive bit, and if so, whether the sensitive bit is a design sensitive bit that is critical to the functionality of the overall device.

If, upon performing SMH lookup, it is determined that the erroneous bit is insensitive or if the erroneous bit is not a critical bit, the sensitivity processor may ignore this error and may loop back to step 200. If, upon the SMH lookup, it is determined that the erroneous bit is a critical bit (i.e., if the error will propagate enough to cause a functional failure of the circuit or is essential to the functionality of the entire circuit), the sensitivity processor may determine that a suitable correction action be taken to correct that critical error (step 210). For example, this error may require device configuration, partial reconfiguration, or other system recovery procedure to be taken.

Figure 5:
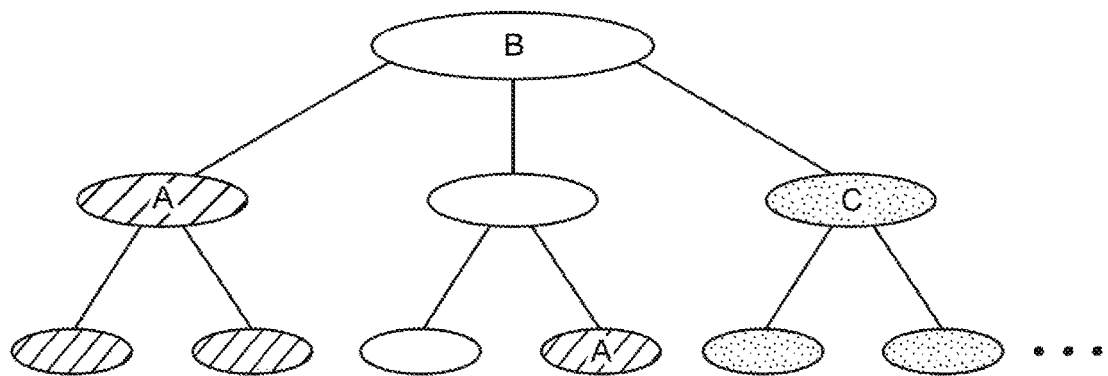
FIG. 5 is a diagram of an illustrative design hierarchy with different sensitivity regions in accordance with an embodiment of the present invention.

When the logic resources on a programmable integrated circuit 10 are configured to implement a user-defined logic function, the logic resources can be organized in different logic "partitions." The various logic partitions can be arranged according to a logic design hierarchy. FIG. 5 is a diagram of an exemplary logic design hierarchy having at least ten logic partitions. Partitions in the upper portions of the logic design hierarchy represent partitions related to the overall functionality of the logic design, whereas partitions in the lower portions of the logic design hierarchy represent partitions related to more specific attributes of the logic design.

The hierarchy of FIG. 5 includes three types of logic partitions. A first group of logic partitions (e.g., partitions labeled as "A") may be assigned a first sensitivity tag. A second group of logic partitions (e.g., partitions labeled as "B") may be assigned a second sensitivity tag that is different than the first tag. A third group of logic partitions (e.g., partitions labeled as "C") may be assigned a third sensitivity tag that is different than the first and second tags. Portions of the logic hierarchy that does not have an explicitly assigned sensitivity tag may be handled according to the sensitivity tag that is assigned to its parent partition in the hierarchy. The type of sensitivity tag that is assigned to each logic partition may be selected manually by the user or may be automatically set using computer-aided design tools. Devices resources that are not being used to implement the custom logic function are not part of any design partition and is therefore excluded from the design hierarchy (i.e., each partition in the logic design hierarchy only includes bits that are in use by the current logic function).

In an embodiment of the present invention, the user may be given an opportunity to perform "hierarchy tagging," a capability that allows the user to tag only selected partitions of the overall design hierarchy as critical for device operation. Partitions having the same sensitivity tag (or region tag) may be considered as part of one sensitivity region. The sensitivity tag is therefore sometimes considered a region identifier.

In the example of FIG. 5, there may be a first sensitivity region that includes all logic partitions with tag A, a second sensitivity region that includes all logic partitions with tag B, and a third sensitivity region that includes all logic partitions with tag C. Each sensitivity region may require a corresponding corrective action. When an SEU occurs in the first sensitivity region, a first corrective action may be triggered. When an SEU occurs in the second sensitivity region, a second corrective action may be triggered. When an SEU occurs in the third sensitivity region, a third corrective action may be triggered. If desired, one or more of the sensitivity regions need not trigger any corrective action (i.e., at least one of the sensitivity regions include logic partitions having bits that are not critical). The example of FIG. 5 is merely illustrative. In general, the logic circuitry on device 10 may be organized into any suitable number of sensitivity regions.

Figure 6:
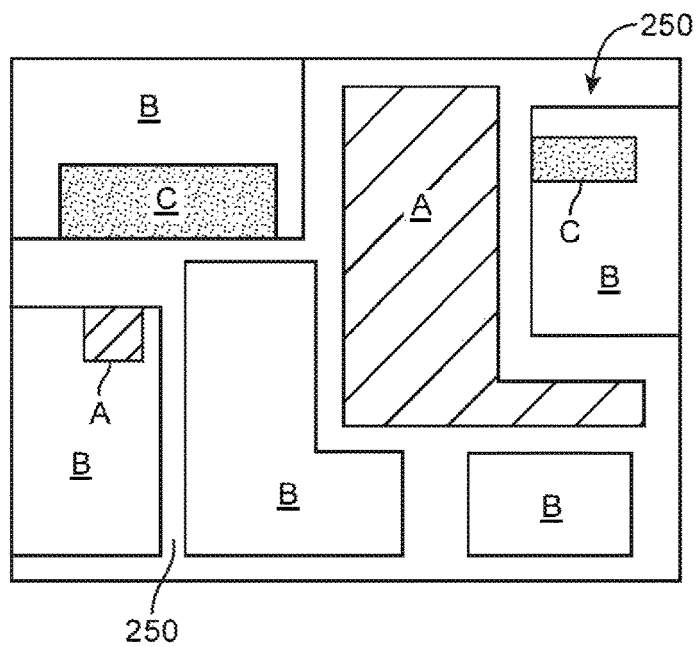
FIG. 6 is a diagram of an illustrative design hierarchy sensitivity map in accordance with an embodiment of the present invention.

FIG. 6 is a diagram illustrating how device resources on integrated circuit 10 can be grouped into different sensitivity regions. One can think of FIG. 6 as a physical representation of the logic shown in FIG. 5. As shown in FIG. 6, device logic resources (e.g., CRAM memory elements) on device 10 may be organized into separate partitions. Resources that are not part of any partition (see, e.g., region 250 in FIG. 6) are not being used to implement this particular design. Because CRAM bits that are located in region 250 are not used in the design at all, these bits may be assigned a sensitivity tag of zero, which forces these bits to be completely excluded from the sensitivity mapping.

In the example of FIG. 6, partitions that are assigned a sensitivity tag A collectively form a first sensitivity region, partitions that are assigned a sensitivity tag B collectively form a second sensitivity region, and partitions that are assigned a sensitivity tag C collectively form a third sensitivity region. The ability to assign various non-zero sensitivity values to different sensitivity regions that are in use by the design allows the system to potentially ignore non-critical errors or to handle less critical errors without interrupting system operation, which can significantly reduce the design effective FIT rate.

Figure 7:
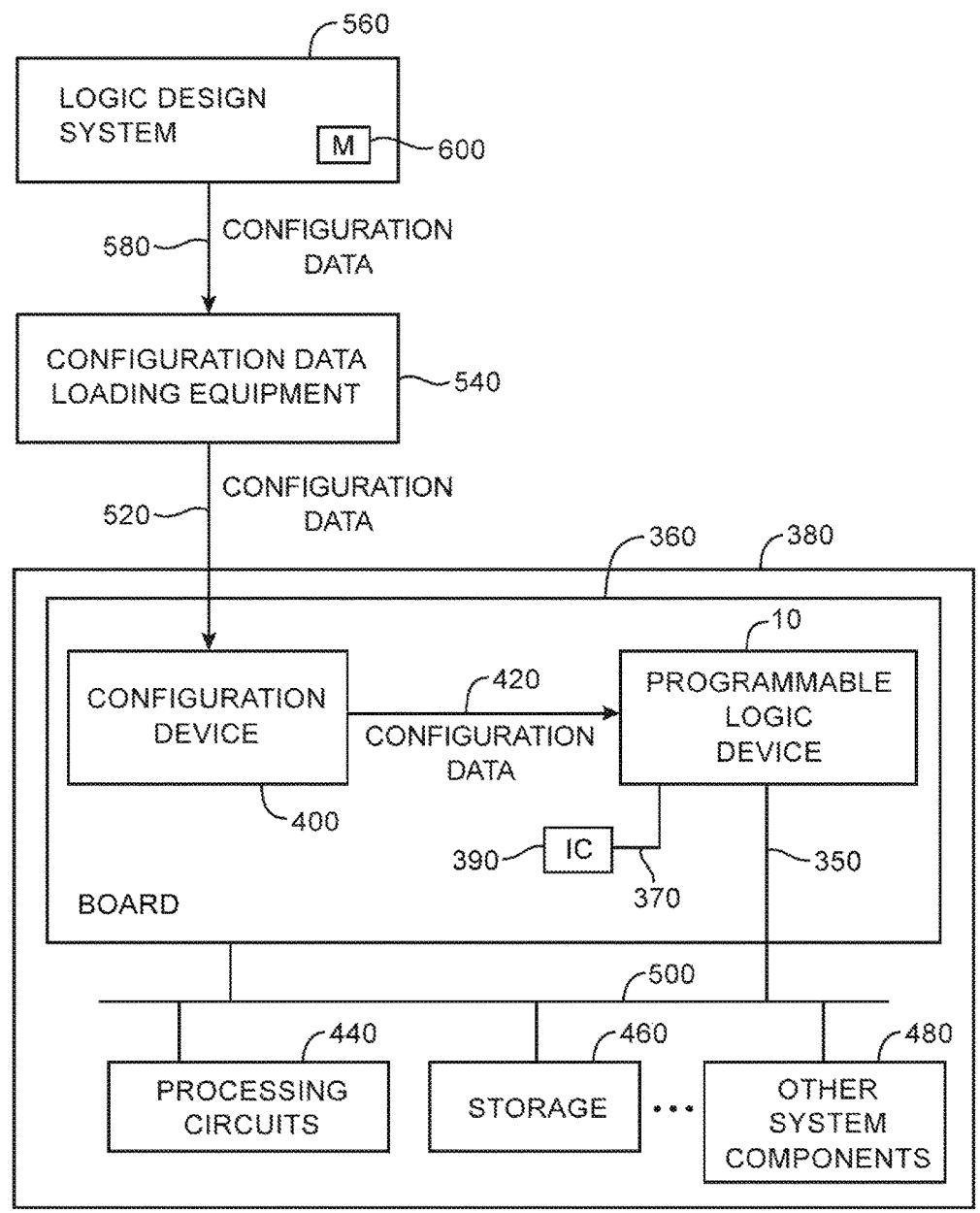
FIG. 7 is a diagram of an illustrative system environment in which a programmable integrated circuit may be configured using a logic design system in accordance with an embodiment of the present invention.

An illustrative system environment for designing and configuring a programmable integrated circuit 10 and for assigning sensitivity tags to different logic partitions is shown in FIG. 7. Device 10 may be mounted on a board 360 in a system 380. Device 10 may receive configuration data from programming equipment or from any other suitable equipment or device.

In the example of FIG. 7, device 10 is a type of programmable integrated circuit that receives configuration data from an associated integrated circuit 400. With this type of arrangement, circuit 400 may, if desired, be mounted on the same board 360 as device 10. Circuit 400 may be a programmable logic device configuration data loading chip that loads configuration data into programmable logic device memory from an external electrically erasable-programmable read-only memory (EEPROM) chip, a programmable logic device configuration data loading chip with built-in memory (sometimes referred to as a configuration device), or any other suitable device. When system 380 boots up (or at another suitable time), the configuration data may be supplied to device 10 from device 400, as shown schematically by path 420. The configuration data that is supplied to device 10 may be stored in its programmable elements 20 (e.g., configuration random-access-memory elements).

System 380 may include processing circuits 440, storage 460, and other system components 480 that communicate with device 10. The components of system 380 may be located on one or more boards such as board 360 or other suitable mounting structures or housings.

Communication paths may be used to interconnect device 10 to other components. For example, communication path 370 may be used to convey data between an integrated circuit 390 that is mounted on board 360 and device 10. Communication paths 350 and 500 can be used to convey signals between device 10 and components 440, 460, and 480.

Configuration device 400 may be supplied with the configuration data for device 10 over a path such as path 520. Configuration device 400 may, for example, receive the configuration data from configuration data loading equipment 540 or other suitable equipment that stores the configuration data in configuration device 400. Device 400 may be loaded with data before or after installation on board 360.

It can be a significant undertaking to design and implement a desired logic circuit in a programmable logic device. Logic designers therefore generally use logic design systems based on computer-aided-design (CAD) tools to assist them in designing circuits. A logic design system (sometimes referred to as a circuit design system) can help a logic designer design and test complex circuits for a system. When a design is complete, the logic design system may be used to generate configuration data for electrically programming the appropriate programmable logic device. The logic design system may be implemented on computing equipment.

As shown in FIG. 7, the configuration data produced by a logic design system 560 may be provided to equipment 540 over a path such as path 580. Equipment 540 provides the configuration data to device 400 so that device 400 can later provide this configuration data to device 10 over path 420. System 560 may be based on one or more computers and one or more software programs. In general, software and data may be stored on any computer-readable medium (storage) in system 560 and is shown schematically as storage 600.

In a typical scenario, logic design system 560 is used by a logic designer to create a custom circuit design. The system 560 produces corresponding configuration data which is provided to configuration device 400. Upon power-up, configuration device 400 and data loading circuitry on device 10 is used to load the configuration data into the programmable memory elements 20 of device 10. Device 10 may then be used in normal operation of system 380.

Figure 8:
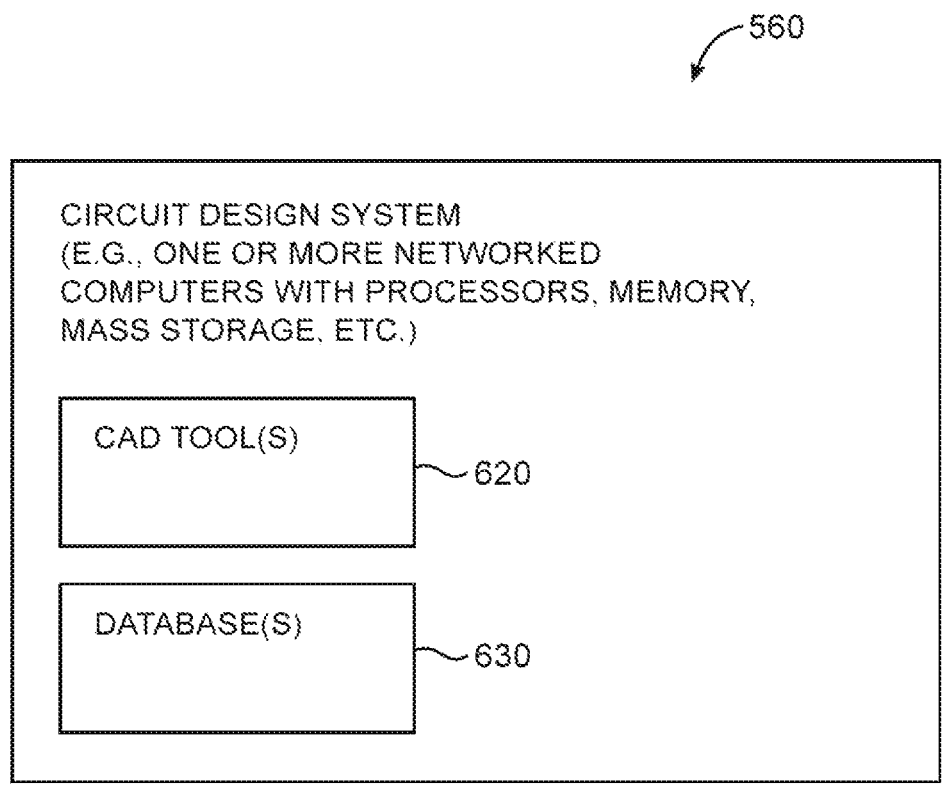
FIG. 8 is a diagram of a logic design system for generating configuration data for implementing custom circuit designs in programmable integrated circuits in accordance with an embodiment of the present invention.

An illustrative logic design system 560 in accordance with the present invention is shown in FIG. 8. System 560 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 620 and databases 630 reside on system 560. During operation, executable software such as the software of computer aided design tools 620 runs on the processor(s) of system 560. Databases 630 are used to store data for the operation of system 560. In general, software and data may be stored on any computer-readable medium (storage) in system 560. Such storage, which is shown schematically as storage 600 of FIG. 7, may include computer memory chips, removable and fixed media such as hard disk drives, flash memory, compact discs (CDs), DVDs, other optical media, and floppy diskettes, tapes, or any other suitable memory or storage device(s). When the software of system 560 is installed, the storage 600 of system 560 has instructions and data that cause the computing equipment in system 560 to execute various methods (processes). When performing these processes, the computing equipment is configured to implement the functions of the logic design system.

The computer aided design (CAD) tools 620, some or all of which are sometimes referred to collectively as a CAD tool, may be provided by a single vendor or multiple vendors. Tools 620 may be provided as one or more suites of tools (e.g., a compiler suite for performing tasks associated with implementing a circuit design in a programmable logic device) and/or as one or more separate software components (tools). Database(s) 630 may include one or more databases that are accessed only by a particular tool or tools and may include one or more shared databases. Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

Figure 9:
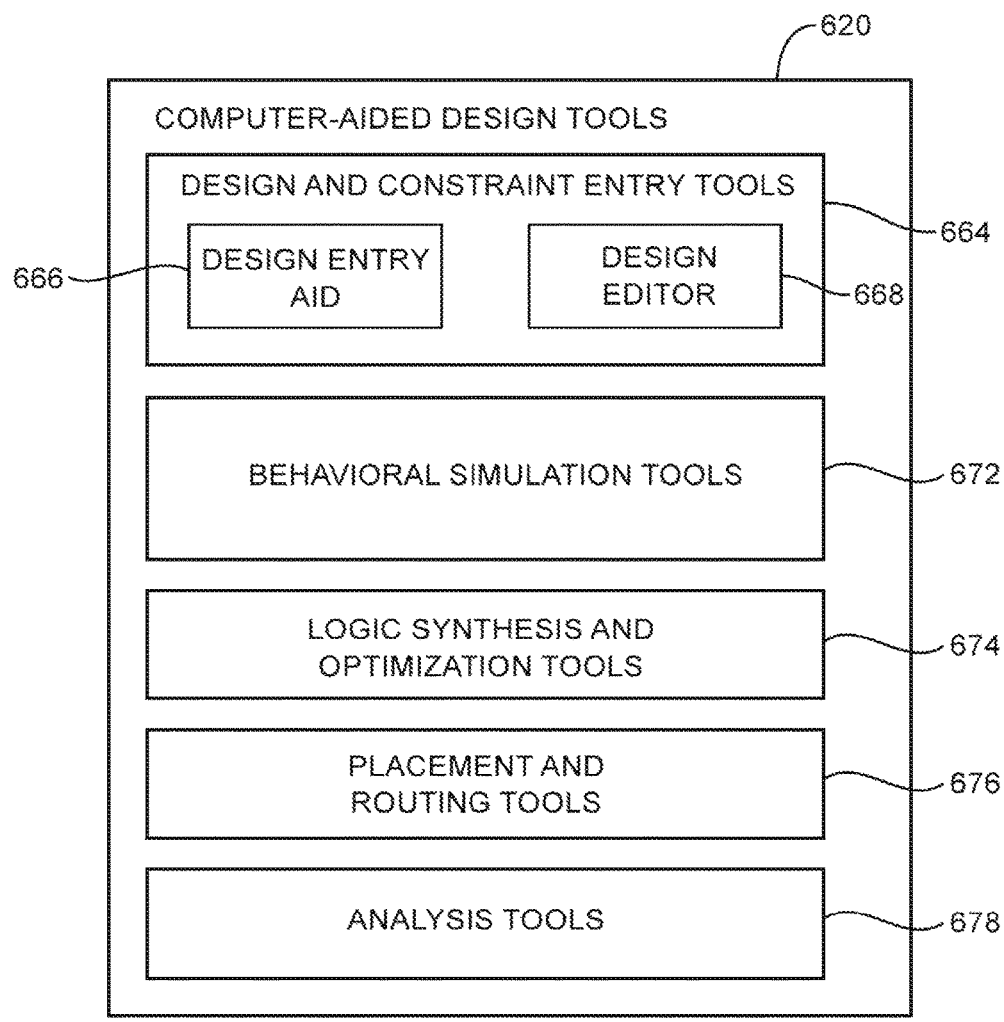
FIG. 9 is a diagram of illustrative computer-aided design (CAD) tools that may be used in a logic design system in accordance with an embodiment of the present invention.

Illustrative computer aided design tools 620 that may be used in a logic design system such as system 560 of FIGS. 7 and 8 are shown in FIG. 9.

The design process typically starts with the formulation of logic circuit functional specifications (e.g., a functional description of the logic circuit). A logic designer can specify how a desired circuit should function using design and constraint entry tools 664. Design and constraint entry tools 664 may include tools such as design and constraint entry aid 666 and design editor 668. Design and constraint entry aids such as aid 666 may be used to help a logic designer locate a desired design from a library of existing logic designs and may provide computer-aided assistance to the logic designer for entering (specifying) the desired design.

As an example, design and constraint entry aid 666 may be used to present screens of options for a user. The user may click on on-screen options to select whether the circuit being designed should have certain features. Design editor 668 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 664 may be used to allow a logic designer to provide a desired logic design using any suitable format. For example, design and constraint entry tools 664 may include tools that allow the logic designer to enter a logic design using truth tables. Truth tables can be specified using text files or timing diagrams and may be imported from a library. Truth table logic design and constraint entry may be used for a portion of a large circuit or for an entire circuit.

As another example, design and constraint entry tools 664 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design and constraint entry tools 664 may allow the logic designer to provide a logic design to the logic design system 560 using a hardware description language such as Verilog hardware description language (HDL) or Very High Speed Integrated Circuit Hardware Description Language (VHDL). The designer of the logic circuit can enter the logic design by writing hardware description language code with editor 668. Blocks of code may be imported from user-maintained or commercial libraries if desired.

After the design has been entered using design and constraint entry tools 664, behavioral simulation tools 672 may be used to simulate the functional performance of the design. If the functional performance of the design is incomplete or incorrect, the logic designer can make changes to the design using design and constraint entry tools 664. The functional operation of the new design can be verified using behavioral simulation tools 672 before synthesis operations have been performed using tools 674. Simulation tools such as tools 672 may also be used at other stages in the design flow if desired (e.g., after logic synthesis). The output of the behavioral simulation tools 672 may be provided to the logic designer in any suitable format (e.g., truth tables, timing diagrams, etc.).

Once the functional operation of the logic design has been determined to be satisfactory, logic synthesis and optimization tools 674 may be used to implement the logic design in a particular programmable logic device (i.e., in the logic and interconnect resources of a particular programmable logic device product or product family).

Tools 674 attempt to optimize the design by making appropriate selections of hardware to implement different logic functions in the logic design based on the logic design data and constraint data entered by the logic designer using tools 664.

After logic synthesis and optimization using tools 674, the logic design system may use tools such as placement and routing tools 676 to perform physical design steps (layout synthesis operations). Placement and routing tools 676 are used to determine how to place the circuits for each logic function within the programmable logic device. For example, if two counters interact with each other, the placement and routing tools 676 may locate these counters in adjacent logic regions on the programmable logic device to reduce interconnect delays or to satisfy timing requirements specifying the maximum permitted interconnect delay. The placement and routing tools 676 create orderly and efficient implementations of logic designs for a given programmable logic device.

Tools such as tools 674 and 676 may be part of a compiler suite (e.g., part of a suite of compiler tools provided by a programmable logic device vendor). In accordance with the present invention, tools such as tools 674, 676, and 678 may automatically take into account the effects of crosstalk between interconnects while implementing a desired circuit design. Tools 674, 676, and 678 may also include timing analysis tools. This allows tools 674 and 676 to satisfy performance requirements (e.g., timing requirements) when generating configuration data for programming integrated circuits such as programmable integrated circuit 10.

After an implementation of the desired logic design in the programmable logic device has been generated using placement and routing tools 676, the implementation of the design may be analyzed and tested using analysis tools 678. After satisfactory optimization operations have been completed using tools 620, tools 620 can produce the configuration data for the programmable logic device.

Figure 10:
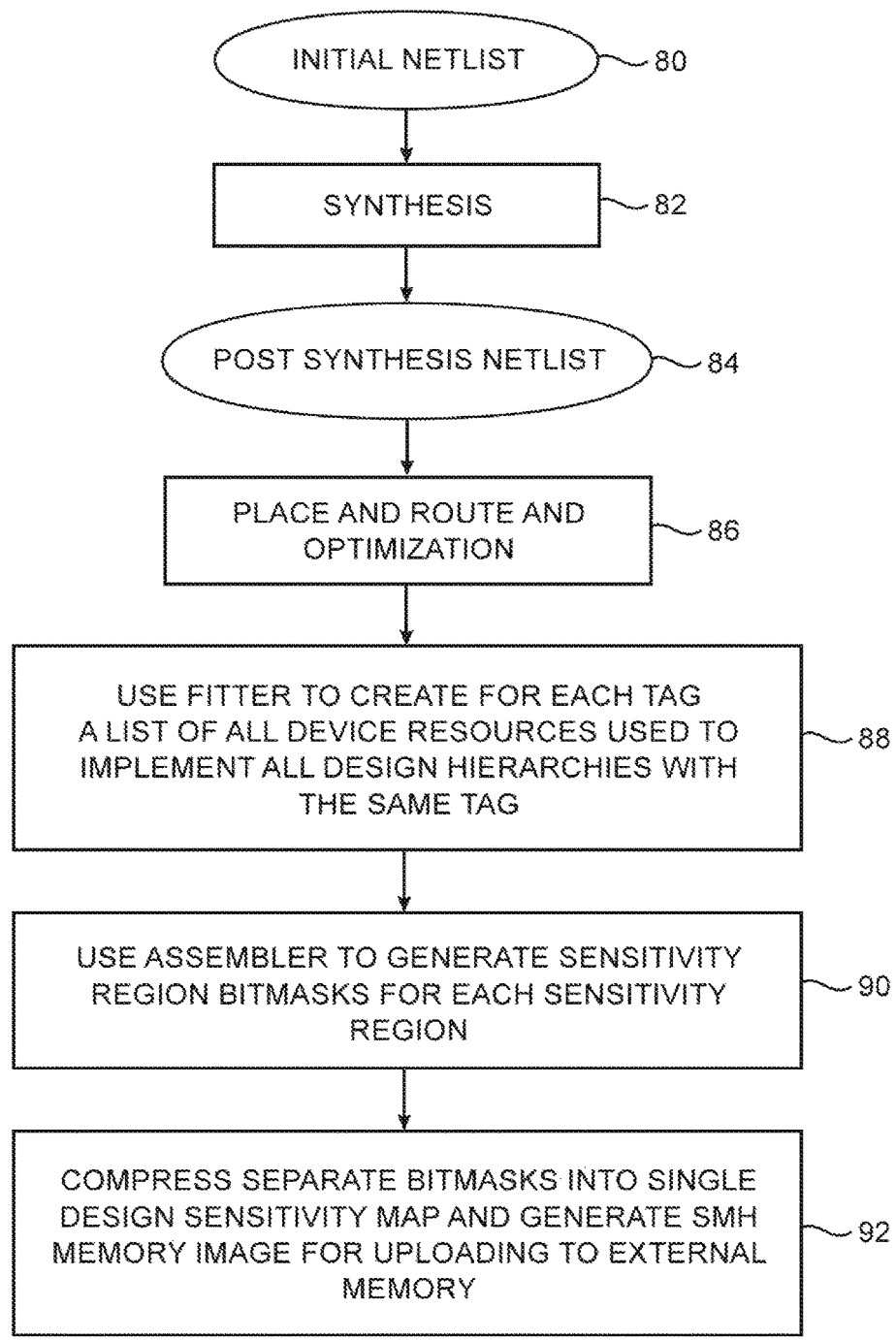
FIG. 10 is a flow chart of illustrative steps for designing a custom logic circuit and creating a sensitivity map header (SMH) memory image file in accordance with an embodiment of the present invention.

Illustrative operations involved in using tools 620 of FIG. 9 to produce sensitivity mapping information are shown in FIG. 10. As shown in FIG. 10, an initial netlist 80 is synthesized at step 82 to produce a post-synthesis netlist 84. At step 86, post synthesis netlist 84 is processed during place and route and optimization operations. During the operations of step 86, the CAD tools 620 take account of the effects of using different positive power supply voltages and/or body bias voltages and, through appropriate selection of power supply and body bias levels, circuit resource assignments, and placement decisions, tools 620 allocate different portions of the logic on device 10 to optimally implement the user-defined logic function described in netlist 80 while balancing system performance and power consumption.

Upon completion of the place and route operation, a Fitter function provided by design tools 620 may be used to perform "hierarchy tagging." In particular, the Fitter creates for each distinct sensitivity tag a list of all device resources that are used to implement logic partitions having the same tag (e.g., all CRAM bits associated with the same sensitivity tag are identified for each sensitivity region).

At step 90, an Assembler function provided by design tools 620 receives the device resource list generated by the Fitter and generates a corresponding sensitivity region bitmask for each sensitivity region (e.g., the Assembler may be used to generate separate CRAM bitmasks to identify the device regions implementing portions of the logic design hierarchy with the same sensitivity tag). For each device resource from the list, the generated region bitmask may include (i) all bits that are set explicitly for that resource and (ii) all bits that may impact the functionality of that resource.

At step 92, the separate region bitmasks may be compressed into a single design sensitivity map, which is packaged as an SMH memory image file that can be uploaded to external memory (see, e.g., FIGS. 2 and 3). Information from the SMH file can be retrieved via an SMH lookup algorithm in accordance with an embodiment of the present invention.

Figure 11:
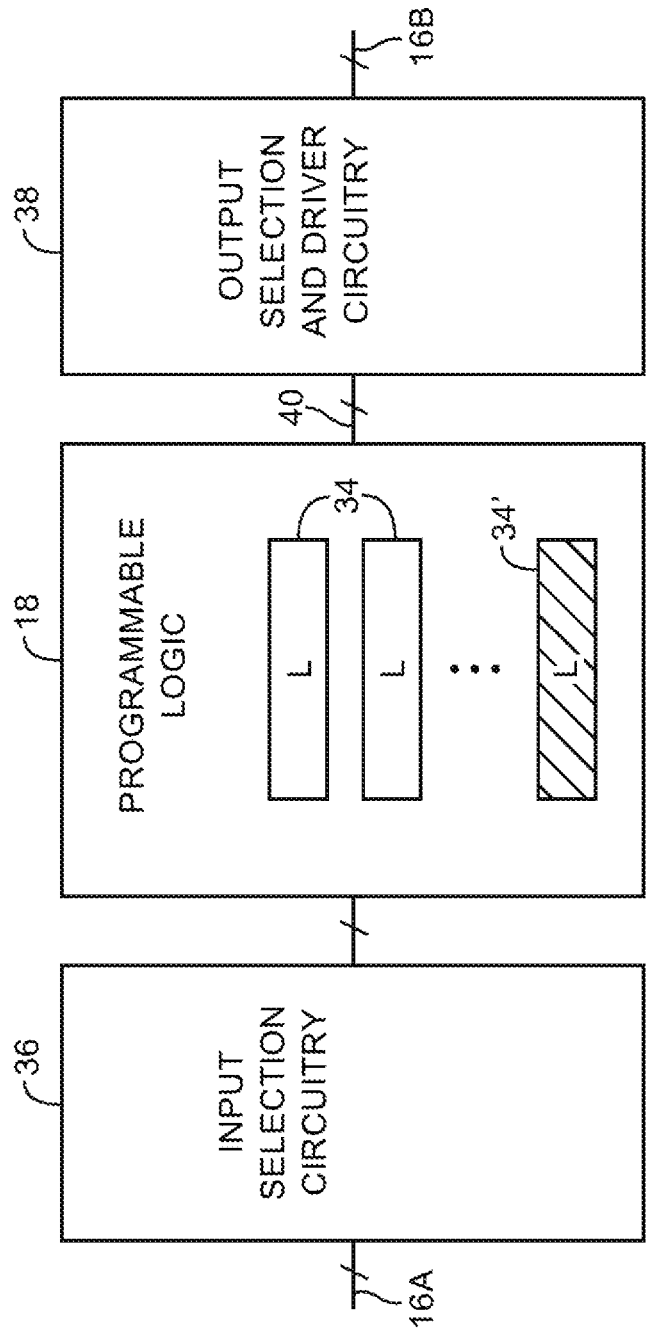
FIG. 11 is a diagram of illustrative programmable logic with input selection circuitry and output selection and driver circuitry in accordance with an embodiment of the present invention.

The assignment of sensitivity tags may depend on the criticality of a particular CRAM bit location in a logic design. A sensitivity region as described above may be defined as a collection of sensitivity rectangles or "tiles." There may be various different types of sensitivity rectangles on a programmable device 10. To illustrate this, a programmable logic region 18 on device 10 is shown in FIG. 11. Programmable logic region 18 (sometimes referred to as a logic array block or "LAB") may have associated input selection circuitry 36 and output selection and driver circuitry 38. Input selection circuitry 36 and output selection and driver circuitry 38 may be formed as part of input-output circuits that are used to drive horizontal interconnects (e.g., interconnects formed along a horizontal axis of device 10) and vertical interconnects (e.g., interconnects formed along a vertical axis of device 10).

As shown in FIG. 11, input selection circuitry 36 may receive input signals via interconnects 16A. For example, interconnects 16A may provide input signals to programmable logic region 18 from other programmable logic regions 18 or from input-output pins 14. Input selection circuitry 36 may be configured to select one or more of the input signals to provide to programmable logic region 18.

Programmable logic region 18 may include smaller regions of programmable logic 34. The smaller programmable logic regions 34 within each programmable logic region 18 may sometimes be referred to as adaptive logic modules (ALMs) or logic elements (LEs). Logic regions 34 may receive the input signals that are selected by input selection circuitry 36 and may perform custom functions on the input signals to produce output signals. The input signals received by each logic region 34 may overlap with input signal portions received by other logic regions 34 (e.g., some of the input signals received by a first logic region 34 may also be received by a second logic region 34). The output signals may be provided to output selection and driver circuitry 38 via output paths 40. The number of logic regions 34 is merely illustrative. If desired, programmable logic region 18 may be formed with any number of logic regions 34 that perform custom functions on input signals that are selected by input selection circuitry 36.

Output selection and driver circuitry 38 may receive output signals via paths 40 and may be configured to provide the output signals to interconnects 16B. If desired, output selection circuitry 38 may be configured to disconnect one or more of interconnects 16B (e.g., by providing no output signal or by providing a high impedance output).

If desired, output selection circuitry 38 may be configured to provide a given output signal to multiple interconnects 16B. For example, it may be desirable to route an output signal from a given logic region 34 to two different regions of integrated circuit 10. In this scenario, output selection and driver circuitry 38 may provide that output signal to two different interconnects of different lengths.

A sensitivity rectangle may include memory elements storing bits that affect the functionality of a particular resource. The logic circuitry of FIG. 11 may be categorized into different types of sensitivity rectangles. A first type of sensitivity rectangle may include bits associated with a particular logic region 34. If any portion of logic element 34 is in use by the design, then all bits of the logic element are considered sensitive.

At least some logic region 18 may include a "secondary region" such as secondary region 34' including bits that should be considered sensitive if any of the logic elements 34 in that logic region 18 is in use. The secondary region is sometimes referred to as a "derived sensitivity rectangle" and can possibly be tagged for multiple logic partitions in the hierarchy. In other words, if a particular logic element 34 is determined to be sensitive, then the associated derived sensitivity rectangle should also be tagged as sensitive.

A second type of sensitivity rectangle may include bits associated with a particular memory array block or digital signal processing (DSP) block. For example, if any portion of a logic region 18 that is configured to operate as a memory module or a digital signal processing module is in use, then all CRAM bits related to that region are considered sensitive. If the block is not in use, then all CRAM bits related to that region are marked as insensitive.

A third type of sensitivity rectangle may include bits that control routing paths coupled to a logic region 18. As an example, all bits controlling multiplexers that route control and data signals to and from a logic region 18 (e.g., bits that control global routing paths in input and output selection circuitry 36 and 38) that is partially in use are considered sensitive. As another example, all bits controlling multiplexers that route control and data signals to a logic element 34 (e.g., bits that control local routing paths in input and output selection circuitry 36 and 38) that is in use are also considered sensitive.

Other types of sensitivity rectangle may include bits that control clock signal routing. For example, all bits controlling multiplexers that are configured to drive clock to blocks that are in use are considered sensitive. In another example, CRAM bits that control first (last) stage of routing in the horizontal and vertical input (output) interconnects are considered sensitive for all logic partitions. The different types of sensitivity rectangles described herein are merely illustrative and do not serve to limit the scope of the present invention. If desired, other types of sensitivity tiles may be included to categorize the different types of logic on device 10.

The compression scheme of the SMH file described above is based on the notion of the sensitivity rectangles. The CRAM bits may be arranged in rows and columns. All CRAM columns that traverse the same sensitivity rectangles will reference the same sensitivity map information. The CRAM row address may be mapped to a corresponding data entry offset in the sensitivity map. Mapped in this way, a single data entry in the SMH file can be used to represent information about each CRAM bit in a sensitive rectangle, thereby compressing the amount of information that needs to be stored.

Figure 12:
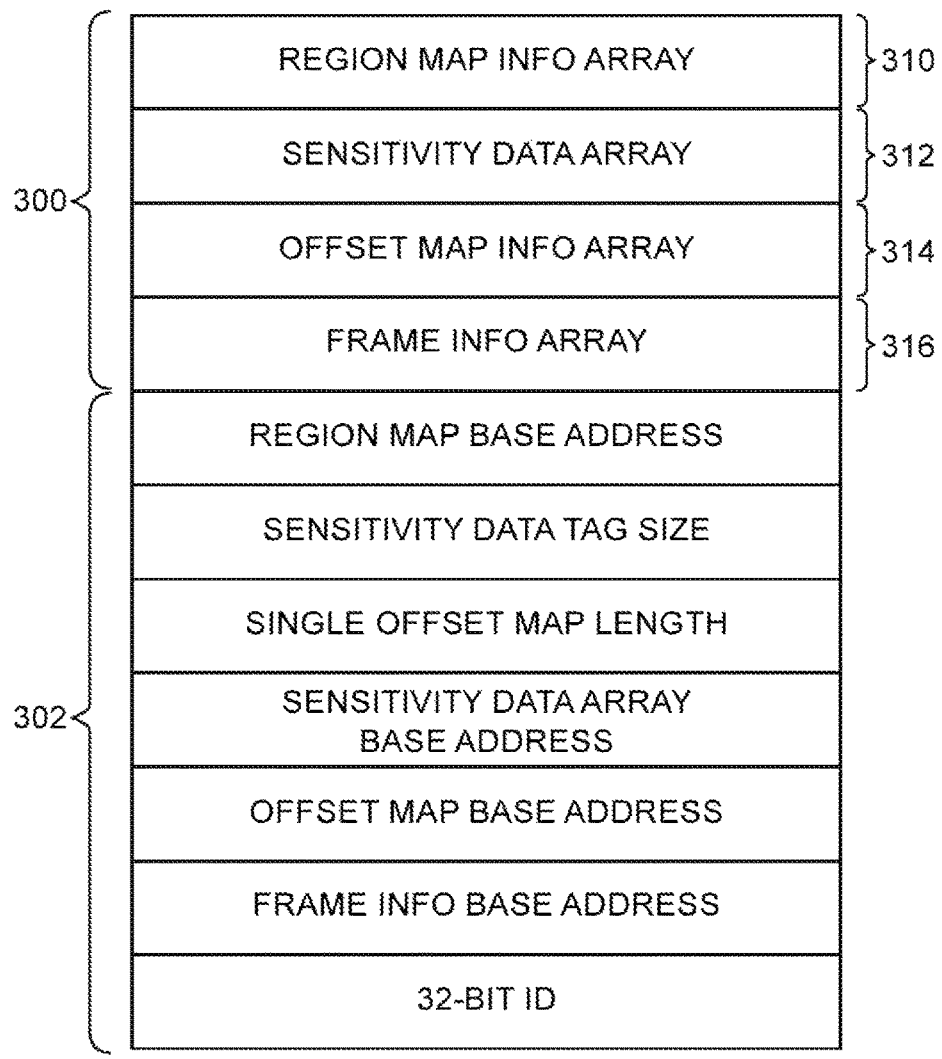
FIG. 12 is a diagram showing illustrative fields in a sensitivity map header in accordance with an embodiment of the present invention.

The corresponding SMH data structures that support this type of compression and hierarchy tagging is shown in FIG. 12. As shown in FIG. 12, the sensitivity map heading may include data information 300 and header information 302. Data information 300 may include fields such as a region map information array 310, a sensitivity data array 312, an offset map information array 314, and a frame information array 316. Header information 302 may include fields such as a region map base address, a sensitivity data tag size, a single offset map length, a sensitivity data array base address, an offset map base address, a frame information base address, and a 32-bit identification number.

In accordance with an embodiment, frame information array 316 may be an array of 32-bit strings each of which addresses a frame on device 10. In particular, the leading 24 bits in a frame information string may serve as an address offset value into the sensitivity data array (labeled herein as "data_offset"), whereas the remaining eight bits in the frame information string may serve as an index for the offset map array (labeled herein as "offset_map_index").

Offset map information array 314 may be an array of 16-bit strings each of which represents an additional offset into the sensitivity data array. The size of each offset map string is defined by the single offset map length value in header information 302.

Sensitivity data array 312 may be an array of sensitivity data words each of which corresponds to a sensitivity tag value. In particular, a sensitivity tag with a value of zero may be assigned to bits that are insensitive for all logic regions on device 10, whereas sensitivity tags with non-zero values may be assigned to sensitive bits and may specify an offset into the region map information array. The size of a single sensitivity data word is defined by the sensitivity data tag size value in header information 302 and may be aligned to a power of two (as an example).

Region map information array 310 may be an array of 16-bit strings each of which corresponds to a non-zero sensitivity tag. The sensitivity data tag serves as an index for the region map information array. Each entry in the region map information array may represent a bitmask of the regions that includes a particular bit of interest and may each be assigned a respective correction action when the particular bit of interest is affected by an SEU.

Figure 13:
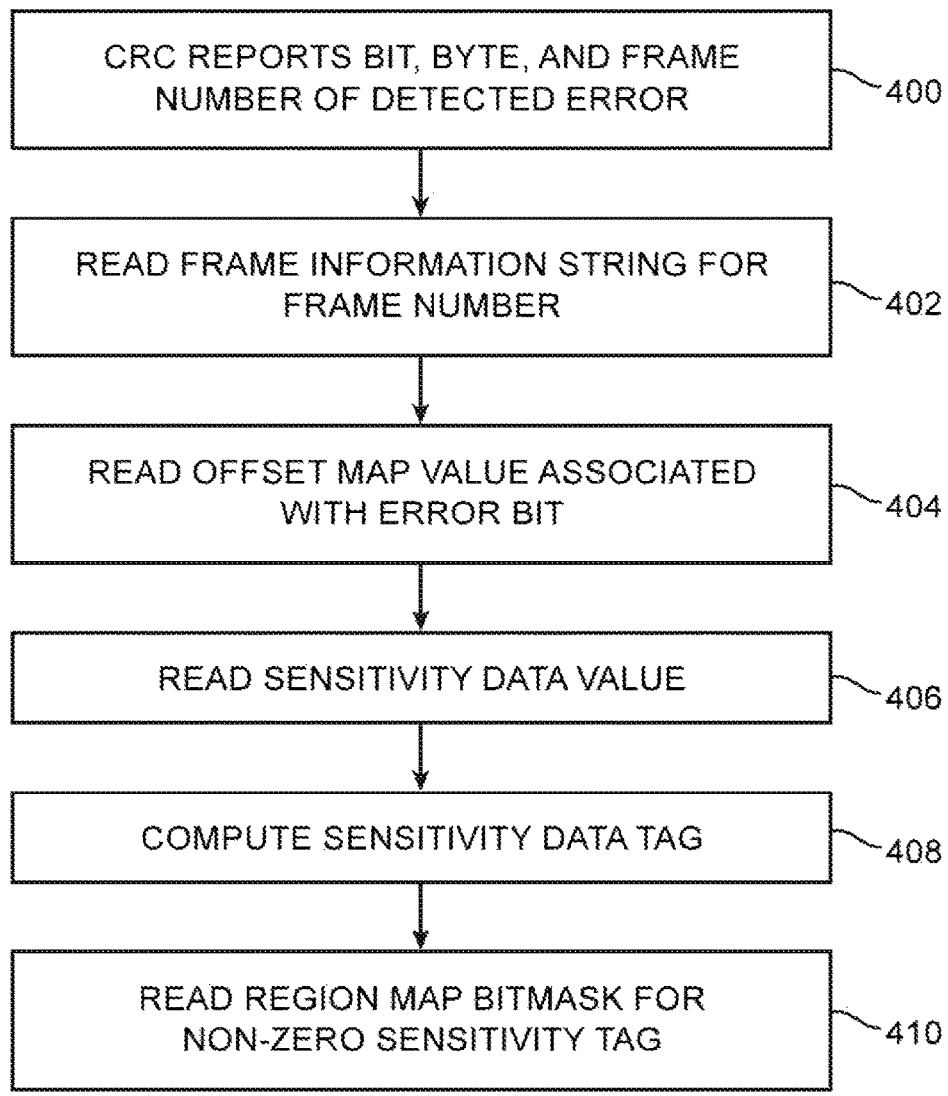
FIG. 13 is flow chart of illustrative steps for performing a sensitivity map header (SMH) lookup for use in determining an appropriate corrective action in response to identifying a soft error in accordance with an embodiment of the present invention.

FIG. 13 is a flow chart of illustrative steps involved in performing an SMH lookup algorithm based on the data structures described in connection with FIG. 12. At step 400, the CRC module may report the bit, byte, and frame number associated with a detected error bit to the sensitivity processor. The sensitivity processor (whether an on-chip sensitivity processor 104 of the type in FIG. 2 or an off-chip sensitivity processor 158 of the type in FIG. 3) may then use this information to perform lookup against the SMH file that is stored on external memory.

At step 402, a 32-bit frame information string corresponding to the reported frame number may be read from frame information array 316. As described in connection with FIG. 12, the retrieved frame information string may include the data_offset and the offset_map_index.

At step 404, a 16-bit offset_map_value corresponding to the offset_map_index may be read from offset map information array 314. The particular location of the offset_map_value may depend on, in addition to the offset_map_index, the offset map base address, single offset map length, and the offset data value for the current byte/bit. For example, the address of the offset_map_value may be computed based on the following equation:

Address=(offset map base address)+(offset_map_index)*(single offset map length)+[byte*8+bit]*2

At step 406, an 8-bit sensitivity_data_word corresponding to the offset_map_value may be read from sensitivity data array 312. The particular location of the sensitivity_data_word may depend on (in addition to the offset_map_value) the sensitivity data tag size, the sensitivity data array base address, and the data_offset. For example, the address of the sensitivity_data_word may be computed based on the following equation:

Address=(offset_map_value)*(sensitivity data tag size)/8+(sensitivity base address)+data_offset At step 408, a sensitivity tag may be computed based on the sensitivity_data_word. The sensitivity tag may be calculated as follows:

sensitivity tag=(sensitivity_data_word>>tag_shift)&& tag_mask where tag_shift={(offset_map_value)*(sensitivity data tag size)}[2:0]

and tag_mask=[0x1<<(sensitivity data tag size)]−1

The ">>" symbol represents a bitwise right shift, whereas the "<<" symbol represents a bitwise left shift. The "&&" symbol represents a bitwise logic AND operation. In general, a computed sensitivity tag value of zero indicates that the detected bit is not critical for any region on device 10 while a non-zero tag value indicates that the detected bit is potentially critical and can be used as an offset in region map information array 310.

If the sensitivity tag is not equal to zero, a region map bitmask may be read from the region map information array 310. The particular location of the region map bitmask may depend on, in addition to the sensitivity tag value, the region map base address. For example the address of the region map bitmask may be computed using the following equation:

Address=(region map base address)+[(sensitivity tag)−1]*2

Once the region bitmask has been retrieved, the sensitivity processor may then determine which corrective action to take to fix the detected error. In certain embodiments, at least some errors associated with sensitive bits can be ignored (i.e., some sensitive bits that will not propagate enough to cause a functional failure or that are not essential for the functionality of the entire circuit need not be corrected). The SMH lookup algorithm described in connection with FIG. 13 is merely illustrative. If desired, other ways of performing sensitivity map lookup with selective hierarchical tagging enabled may be provided.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for operating an integrated circuit that includes a plurality of memory elements and an error detection circuit, comprising:
   detecting an erroneous bit in the plurality of memory elements with the error detection circuit;
   in response to detecting the erroneous bit, determining whether the erroneous bit is being used by the integrated circuit to implement a predetermined logic function; and
   in response to determining that the erroneous bit is being used by the integrated circuit to implement the predetermined logic function, determining whether the erroneous bit is critical to maintain proper functionality of the integrated circuit.

2. The method defined in claim 1, further comprising:
   in response to determining that the erroneous bit is critical to maintain proper functionality of the integrated circuit, correcting the erroneous bit.

3. The method defined in claim 2, wherein correcting the erroneous bit comprises a selected one of:
   reconfiguring all of the plurality of memory elements; and
   reconfiguring a subset of the plurality of memory elements.

4. The method defined in claim 1, further comprising:
   in response to determining that the erroneous bit is not critical to maintain proper functionality of the integrated circuit, continuing to operate the integrated circuit in normal mode without correcting the erroneous bit.

5. The method defined in claim 1, wherein determining whether the erroneous bit is critical to maintain proper functionality of the integrated circuit comprises accessing sensitivity map information that is stored on external memory.

6. The method defined in claim 5, wherein accessing the sensitivity map information comprises accessing the sensitivity map information with a sensitivity processor on the integrated circuit.

7. The method defined in claim 5, wherein accessing the sensitivity map information comprises accessing the sensitivity map information with a sensitivity processor that is external to the integrated circuit.

8. The method defined in claim 1, wherein the error detection circuit comprises a cyclic redundancy check (CRC) circuit.

9. Circuitry, comprising:
   a plurality of memory elements; and
   an error detection circuit that detects a soft error in the plurality of memory elements and identifies a memory bit affected by the soft error, wherein the error detection circuit is further configured to obtain a sensitivity tag corresponding to the memory bit, to correct the soft error by performing a first corrective action when a sensitivity tag of a first type is obtained, and to correct the soft error by performing a second corrective action that is different than the first corrective action when a sensitivity tag of a second type is obtained.

10. The circuitry defined in claim 9, wherein the plurality of memory elements are formed on an integrated circuit, and wherein the integrated circuit is configured to operate in normal mode without correcting the soft error when a sensitivity tag of a third type is obtained.

11. The circuitry defined in claim 10, wherein the sensitivity tag is obtained from memory that is external to the integrated circuit and that stores predetermined sensitivity map information that includes the sensitivity tag, wherein the sensitivity map information includes a frame information array, and wherein the error detection circuit retrieves an entry from the frame information array based on the location of the soft error.

12. The circuitry defined in claim 11, wherein the predetermined sensitivity map information further includes an offset map information array, and wherein the error detection circuit is further configured to retrieve an entry from the offset map information array based at least partly on the entry retrieved from the frame information array.

13. The circuitry defined in claim 12, wherein the predetermined sensitivity map information further includes a sensitivity data array, wherein the error detection circuit is further configured to retrieve an entry from the sensitivity data array based at least partly on the entry retrieved from the offset map information array, and wherein the entry retrieved from the sensitivity data array corresponds to the obtained sensitivity tag.

14. The circuitry defined in claim 13, wherein the predetermined sensitivity map information further includes a region map information array, wherein the error detection circuit is further configured to retrieve an entry from the region map information array based on the sensitivity tag, and wherein the entry retrieved from the region map information array corresponds to a bitmask of logic regions on the integrated circuit that the soft error affects.

15. The circuitry defined in claim 14, wherein the error detection circuit is further configured to detect an additional soft error in the plurality of memory elements and to obtain from the external memory an additional sensitivity tag that corresponds to the additional soft error and that is different than the sensitivity tag, wherein the sensitivity tag corresponds to a first group of logic circuitry on the integrated circuit, wherein the additional sensitivity tag corresponds to a second group of logic circuitry on the integrated circuit, and wherein the first and second groups of logic circuitry on the integrated circuit are in use by the integrated circuit to implement a desired logic function.

16. A method of operating an integrated circuit having a plurality of memory elements and an error detection circuit, comprising:
- with the error detection circuit, detecting an erroneous bit in the plurality of memory elements;
- determining whether the erroneous bit is being used by the integrated circuit to implement a custom function; and
- in response to determining that the erroneous bit is in use by the integrated circuit to implement the custom function, identifying particular logic regions on the integrated circuit that are affected by the erroneous bit.

17. The method defined in claim 16, further comprising:
- determining whether the identified logic regions are critical to proper functionality of the integrated circuit; and
- in response to determining that the identified logic regions are critical to proper functionality of the integrated circuit, correcting the erroneous bit.

18. The method defined in claim 17, further comprising:
- in response to determining that the erroneous bit does not cause functional failure for the integrated circuit, ignoring the erroneous bit without taking any corrective action.

19. The method defined in claim 16, further comprising:
- in response to determining that the erroneous bit is not used by the integrated circuit to implement any custom function, ignoring the erroneous bit without taking corrective action.

20. The method defined in claim 16, further comprising:
- in response to determining that the identified logic regions are assigned a sensitivity tag of a first type, correcting the erroneous bit by performing a first corrective action; and
- in response to determining that the identified logic regions are assigned a sensitivity tag of a second type, correcting the erroneous bit by performing a second corrective action that is different than the first corrective action.

* * * * *